(12) United States Patent
Liu et al.

(10) Patent No.: US 8,729,397 B2
(45) Date of Patent: *May 20, 2014

(54) EMBEDDED STRUCTURE

(75) Inventors: Yi-Chun Liu, New Taipei (TW); Wei-Ming Cheng, Kaohsiung (TW); Tsung-Yuan Chen, Taoyuan County (TW); Shu-Sheng Chiang, Taipei (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/323,831

(22) Filed: Dec. 13, 2011

(65) Prior Publication Data

US 2012/0085569 A1    Apr. 12, 2012

Related U.S. Application Data

(62) Division of application No. 12/190,602, filed on Aug. 13, 2008, now Pat. No. 8,132,321.

(51) Int. Cl.
*H05K 1/00* (2006.01)

(52) U.S. Cl.
USPC ........... 174/250; 174/251; 174/255; 174/156; 174/157; 174/260; 174/261; 174/262; 174/263; 174/264; 174/265; 174/266; 174/532; 361/309; 361/748; 361/760; 361/795; 257/306; 257/532; 257/737; 257/738; 257/751; 257/758; 257/774; 257/781; 257/784; 29/829; 29/830; 29/846; 29/852; 438/107; 438/124; 438/584; 438/613; 438/677; 324/537; 324/755.08; 156/272.2; 428/209; 430/284.1; 430/314; 106/1.18; 205/125

(58) Field of Classification Search
USPC ......... 174/250, 251, 255–257, 260–266, 532; 361/309, 748, 760, 795; 257/306, 532, 257/737, 738, 751, 758, 774, 781, 784; 29/829, 830, 846, 852; 438/107, 124, 438/584, 613, 677; 106/1.18; 156/272.2; 205/125; 324/537, 755.08; 428/209; 430/284.1, 314
See application file for complete search history.

(56) References Cited

U.S. PATENT DOCUMENTS

| | | | | |
|---|---|---|---|---|
| 5,089,376 A | * | 2/1992 | Setthachayanon | 430/284.1 |
| 5,153,384 A | * | 10/1992 | Iijima et al. | 174/257 |
| 5,362,926 A | * | 11/1994 | Fukuda et al. | 174/256 |
| 5,826,330 A | * | 10/1998 | Isoda et al. | 29/852 |
| 6,262,579 B1 | * | 7/2001 | Chazan et al. | 324/537 |
| 6,548,224 B1 | * | 4/2003 | Chen et al. | 430/314 |
| 6,737,728 B1 | * | 5/2004 | Block et al. | 257/532 |
| 6,835,895 B1 | * | 12/2004 | Asai et al. | 174/255 |

(Continued)

FOREIGN PATENT DOCUMENTS

| | | |
|---|---|---|
| CN | 101180727 A | 5/2008 |
| TW | I310599 | 6/2009 |

*Primary Examiner* — Xiaoliang Chen
(74) *Attorney, Agent, or Firm* — Winston Hsu; Scott Margo (57) ABSTRACT

An embedded structure of circuit board is provided. The embedded structure includes a substrate, a first patterned conductive layer disposed on the substrate and selectively exposing the substrate, a first dielectric layer covering the first patterned conductive layer and the substrate, a pad opening disposed in the first dielectric layer, and a via disposed in the pad opening and exposing the first patterned conductive layer, wherein the outer surface of the first dielectric layer has a substantially even surface.

20 Claims, 8 Drawing Sheets

(56) References Cited

U.S. PATENT DOCUMENTS

| | | | |
|---|---|---|---|
| 6,930,256 B1 | 8/2005 | Huemoeller et al. | |
| 6,930,257 B1 | 8/2005 | Hiner et al. | |
| 6,967,124 B1 | 11/2005 | Huemoeller et al. | |
| 6,987,661 B1 | 1/2006 | Huemoeller et al. | |
| 7,028,400 B1 | 4/2006 | Hiner et al. | |
| 7,297,562 B1 | 11/2007 | Huemoeller et al. | |
| 7,312,103 B1 | 12/2007 | Huemoeller et al. | |
| 7,334,326 B1 | 2/2008 | Huemoeller et al. | |
| 7,340,829 B2* | 3/2008 | Wang | 29/852 |
| 7,916,492 B1* | 3/2011 | Zhong et al. | 361/760 |
| 7,954,234 B2* | 6/2011 | Kodani et al. | 29/852 |
| 7,985,930 B2* | 7/2011 | Asai et al. | 174/264 |
| 8,191,248 B2* | 6/2012 | Liu et al. | 29/852 |
| 8,232,655 B2* | 7/2012 | Arvin et al. | 257/781 |
| 2001/0002625 A1* | 6/2001 | Fujii et al. | 174/262 |
| 2001/0052183 A1* | 12/2001 | Iba et al. | 29/846 |
| 2002/0066595 A1* | 6/2002 | Ohta et al. | 174/265 |
| 2002/0152611 A1* | 10/2002 | Tung et al. | 29/846 |
| 2003/0137056 A1* | 7/2003 | Taniguchi et al. | 257/774 |
| 2004/0025333 A1* | 2/2004 | Hirose et al. | 29/830 |
| 2004/0145855 A1* | 7/2004 | Block et al. | 361/309 |
| 2004/0226745 A1* | 11/2004 | En | 174/262 |
| 2005/0041398 A1 | 2/2005 | Huemoeller et al. | |
| 2005/0103520 A1* | 5/2005 | Saiki et al. | 174/250 |
| 2005/0146034 A1* | 7/2005 | Andreyushchenko et al. | 257/751 |
| 2005/0211561 A1* | 9/2005 | En | 205/125 |
| 2005/0284655 A1* | 12/2005 | Hsu et al. | 174/255 |
| 2006/0003495 A1* | 1/2006 | Sunohara et al. | 438/124 |
| 2006/0084251 A1* | 4/2006 | Nakagawa et al. | 438/584 |
| 2006/0084253 A1* | 4/2006 | Mizukoshi et al. | 438/584 |
| 2006/0138592 A1* | 6/2006 | Block et al. | 257/532 |
| 2006/0191709 A1* | 8/2006 | Kim et al. | 174/255 |
| 2006/0202342 A1* | 9/2006 | Andreyushchenko et al. | 257/758 |
| 2007/0009710 A1* | 1/2007 | Kurita et al. | 428/141 |
| 2007/0085126 A1* | 4/2007 | Hsu | 257/306 |
| 2007/0095466 A1* | 5/2007 | Tsuda | 156/272.2 |
| 2007/0138635 A1* | 6/2007 | Ikumo et al. | 257/738 |
| 2007/0155174 A1* | 7/2007 | Taniguchi et al. | 438/667 |
| 2007/0159200 A1* | 7/2007 | Kimura et al. | 324/765 |
| 2007/0230151 A1* | 10/2007 | Hayashi et al. | 361/795 |
| 2007/0266886 A1* | 11/2007 | En et al. | 106/1.18 |
| 2007/0277373 A1* | 12/2007 | Takai et al. | 29/829 |
| 2007/0281474 A1* | 12/2007 | Suzuki et al. | 438/677 |
| 2008/0020132 A1* | 1/2008 | Huemoeller et al. | 427/98.5 |
| 2008/0041615 A1* | 2/2008 | Zhong et al. | 174/255 |
| 2008/0043447 A1* | 2/2008 | Huemoeller et al. | 361/748 |
| 2008/0149369 A1* | 6/2008 | Kawamura et al. | 174/251 |
| 2008/0189943 A1* | 8/2008 | Hirose et al. | 29/852 |
| 2008/0230263 A1* | 9/2008 | En | 174/262 |
| 2008/0236876 A1* | 10/2008 | Kodama et al. | 174/260 |
| 2008/0247704 A1* | 10/2008 | Kodama et al. | 385/14 |
| 2008/0257596 A1* | 10/2008 | Kaneko | 174/264 |
| 2008/0258300 A1* | 10/2008 | Kobayashi et al. | 257/737 |
| 2008/0272502 A1* | 11/2008 | Nakasato et al. | 257/784 |
| 2008/0277148 A1* | 11/2008 | Asai et al. | 174/255 |
| 2008/0293234 A1* | 11/2008 | Ikumo et al. | 438/613 |
| 2008/0308308 A1* | 12/2008 | Kobayashi | 174/257 |
| 2009/0035541 A1* | 2/2009 | Yokozawa et al. | 428/209 |
| 2009/0170241 A1* | 7/2009 | Shim et al. | 438/107 |
| 2010/0065324 A1* | 3/2010 | Liu et al. | 174/266 |
| 2010/0071940 A1* | 3/2010 | Ejiri et al. | 174/257 |
| 2012/0160551 A1* | 6/2012 | Liu et al. | 174/257 |

\* cited by examiner

EMBEDDED STRUCTURE

CROSS REFERENCE TO RELATED APPLICATIONS

This application is a divisional application of and claims the benefit of U.S. patent application Ser. No. 12/190,602, filed Aug. 13, 2008.

BACKGROUND OF THE INVENTION

1. Field of the Invention

The present invention relates to an embedded structure. In particular, the present invention relates to an embedded structure of circuit board with a smoother surface on the inner wall.

2. Description of the Prior Art

Circuit boards are essential elements in electronic devices. The function of the circuit boards is to define the pre-determined circuit patterns on a solid surface. For the trend of miniaturization of the electronic devices, the line width and the line space of the conductive wires on the circuit boards are narrower and narrower.

Currently, there are two methods available to form the circuit boards to meet the demand. The first one is to transfer-print patterned wires into a dielectric layer. The other one is to pattern a substrate by laser to define a damascene structure, then uses a conductive material to fill the recesses on the substrate to complete an embedded structure. Generally speaking, the surface of the substrate is required to be activated in advance to allow the conductive material to successfully fill the recesses on the substrate, frequently by electroless plating methods. Even more, a material is proposed to allow the conductive material to be disposed on the recesses on the substrate without a prior activation procedure for the electroless plating.

Figure 1:
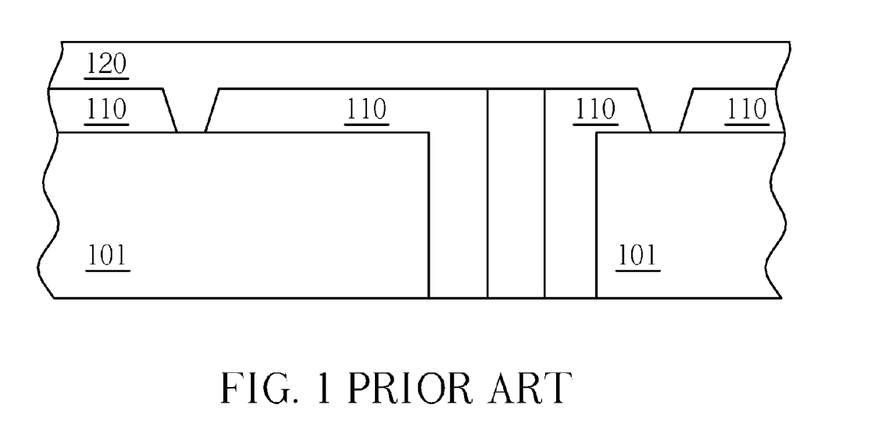
FIGS. 1-4 illustrate a conventional method to form an embedded structure in the prior art.

FIGS. 1-4 illustrate a conventional method to form an embedded structure. As shown in FIG. 1, first, a substrate 101 is provided. A first patterned copper layer 110 is disposed on the substrate 101 and partially exposes the substrate 101. A first dielectric layer 120 covers the first patterned copper layer 110 and the substrate 101.

Figure 2:
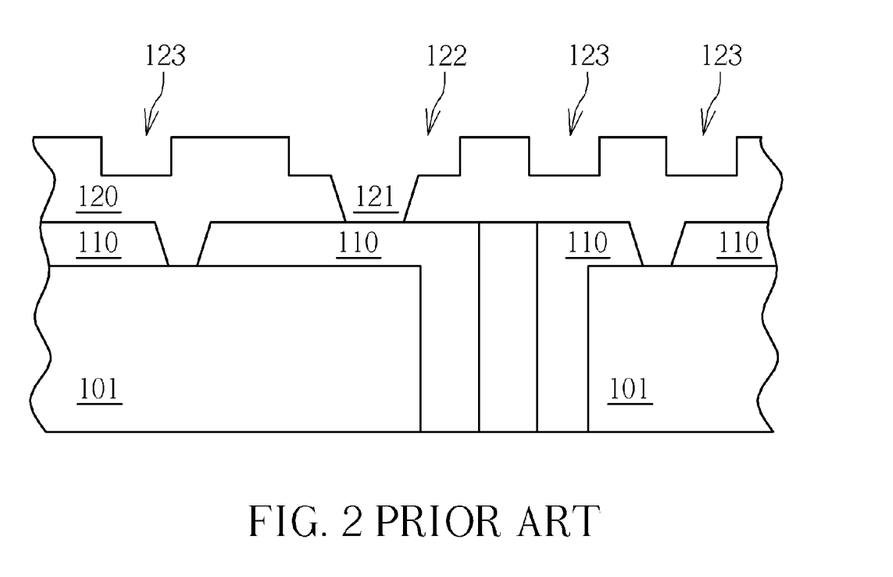
Figure 3:
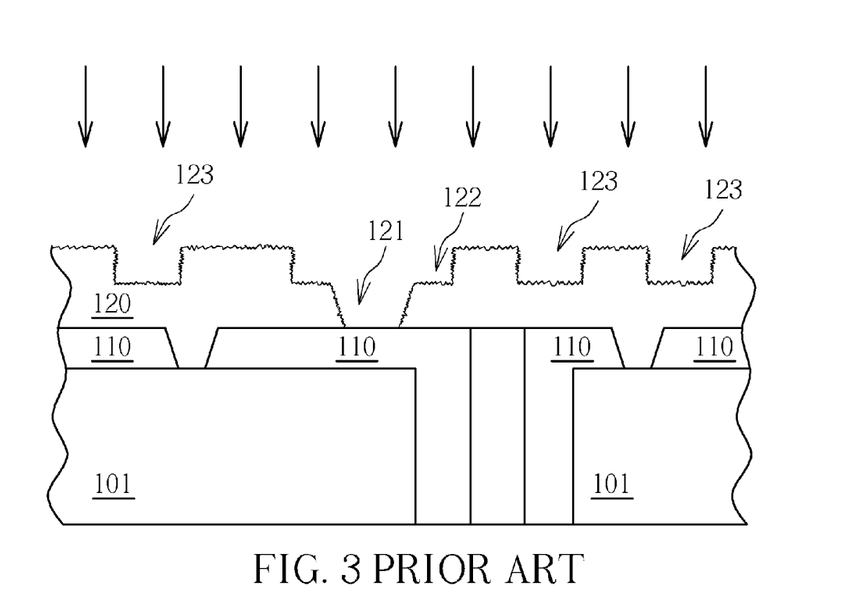
Figure 4:
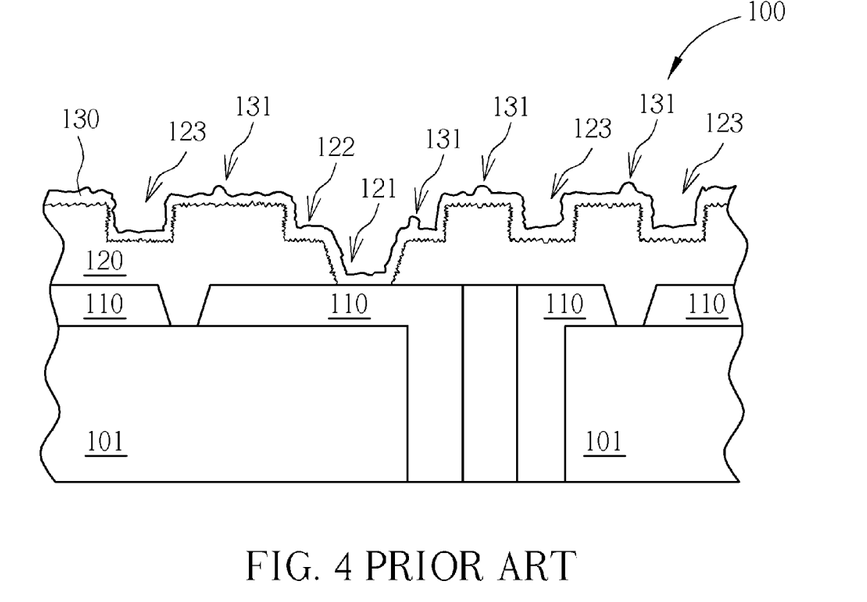

As shown in FIG. 2, the first dielectric layer 120 is patterned to form a pad opening 122, a via 121 integrally formed with the pad opening 122, and a trench 123 adjacent to the pad opening 122. The via 121 exposes a portion of the first patterned copper layer 110. Because residues may remain on the exposed surface of the first patterned copper layer 110 and would hinder the following electric connection, a desmearing procedure is carried out, as shown in FIG. 3 to remove the residues on the exposed surface of the first patterned copper layer 110 and to facilitate the following electric connection. The desmearing procedure may be carried out by employing plasma or an oxidizing agent, such as permanganate. In addition to removing all the residues on the exposed surface of the first patterned copper layer 110, the desmearing procedure also etches the surface of the first dielectric layer 120, including sidewalls of the pad opening 122, the via 122 as well as the trench 123, thereby forming a rugged surface on the first dielectric layer 120. If such rugged surface further undergoes a copper deposition, as shown in FIG. 4, undesirable lumps 131 occur everywhere in the copper layer 130 and deteriorate the quality of the copper layer 130, or the rugged surface limits the design of circuit of high density. Even more, the rugged surface of the trench 123 results in rugged circuits and causes signal loss. The copper layer 130 of bad quality jeopardizes the reliability of the embedded structure 100, of the circuit board and of the electric device made thereof. It is a disadvantage to be overcome.

Therefore, an embedded structure of better surface evenness as well as a novel manufacturing process are needed to provide a circuit board with good reliability.

SUMMARY OF THE INVENTION

The present invention therefore proposes a novel embedded structure with a smoother surface on the inner wall as well as a method for making such embedded structure to overcome the aforesaid problems. Because the inner wall of the embedded structure of the present invention has a much smoother surface, the number of copper lumps is minimized and a conductive layer of better quality can be obtained when a layer of copper is deposited on the inner wall of the embedded structure of the present invention, which enhances the reliability of the embedded structure of the present invention. In addition, in one embodiment of the present invention, the embedded structure of the present invention may further have a substantially even outer surface.

The present invention accordingly provides an embedded structure. The embedded structure of the present invention includes a substrate, a first patterned conductive layer disposed on the substrate and selectively exposing the substrate, a first dielectric layer covering the first patterned conductive layer and the substrate, a pad opening disposed in the first dielectric layer, and a via disposed in the pad opening and exposing the first patterned conductive layer, wherein the via and the pad opening together define the embedded structure, and further the inner wall of the via has a roughness C, the inner wall of the pad opening has a roughness B, and the outer surface of the first dielectric layer has a substantially even surface with a roughness A. A, B, C are mutually different.

Because the novel embedded structure of the present invention goes through a patterning step to define the pad opening or the optional trench after the cleaning step, the inner wall of the embedded structure of the present invention may have a smoother surface and avoid the damage of the cleaning step. The cleaning step on one hand facilitates the electrical connection of the first patterned conductive layer and on the other hand lets the interconnection, i.e. the internal electrical connection, in the via have better affinity to the inner wall of the via, which may be further enhanced by a second cleaning step. It is not desirable if the cleaning step is insufficient or overdone.

Moreover, less copper lumps will be formed and a conductive layer of better quality can be obtained when a layer of copper is later deposited on the inner wall of the embedded structure of the present invention, which raises the reliability of the embedded structure of the present invention. In addition, the embedded structure of the present invention may further have a substantially even outer surface due to the protection of the first/the second organic film layer.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel embedded structure as well as a method for making an embedded circuit structure. Because the embedded structure of the present invention has gone through a patterning step after the cleaning step, the inner wall of the embedded structure of the present invention has a smoother surface. Moreover, less copper lumps will be formed and a conductive layer of better quality can be obtained when a layer of copper is later deposited on the inner wall of the embedded structure of the present invention due to the smoother surface, which enhances the reliability of the embedded structure of the present invention. Moreover, the embedded structure of the present invention may further have a substantially even outer surface because of the protection of the first and the second organic film layer during the manufacturing process.

Figure 5:
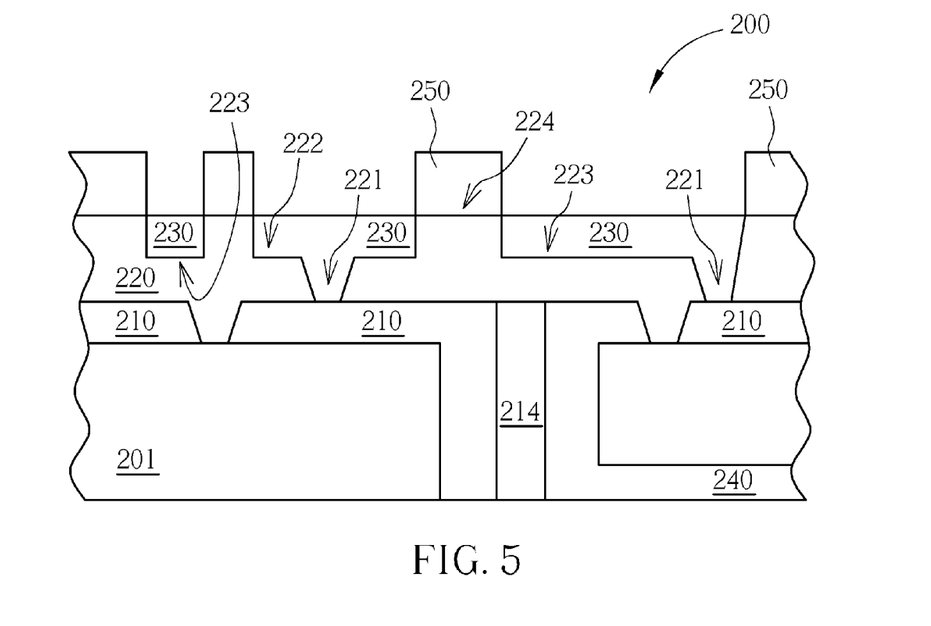
FIG. 5 illustrates an embodiment of the embedded structure of the present invention.

The present invention first provides an embedded structure. FIG. 5 illustrates an embodiment of the embedded structure of the present invention. As shown in FIG. 5, the embedded structure 200 of the present invention includes a substrate 201, a first patterned conductive layer 210, a first dielectric layer 220, a via 221, and a pad opening 222. The substrate 201 is usually a non-conductive material for a circuit board.

The first conductive layer 210 is formed on the substrate 201 to cover the substrate 201 and to selectively expose the substrate 201. The first conductive layer 210 may comprise metal such as Cu or Al. In addition, the first conductive layer 210 is patterned to define a pre-determined circuit to be the first patterned conductive layer 210.

On the first patterned conductive layer 210 is the first dielectric layer 220 for covering the first patterned conductive layer 210 and the substrate 201. The outer surface 224 of the first dielectric layer 220 has a substantially even surface. For example, the outer surface 224 of the first dielectric layer 220 has a roughness A. The roughness A may be expressed by the parameters Ra. Please refer to JIS B 0601-1982 for the details of the parameters Ra. If expressed by Ra, the roughness A is <0.5 µm.

In one embodiment of the present invention, the first dielectric layer 220 may further include a metallic complex, such as Mn, Cr, Pd or Pt. Once activated, such as by laser, the first dielectric layer 220 helps another conductive layer to deposit with the help of the metallic complex.

Figure 16:
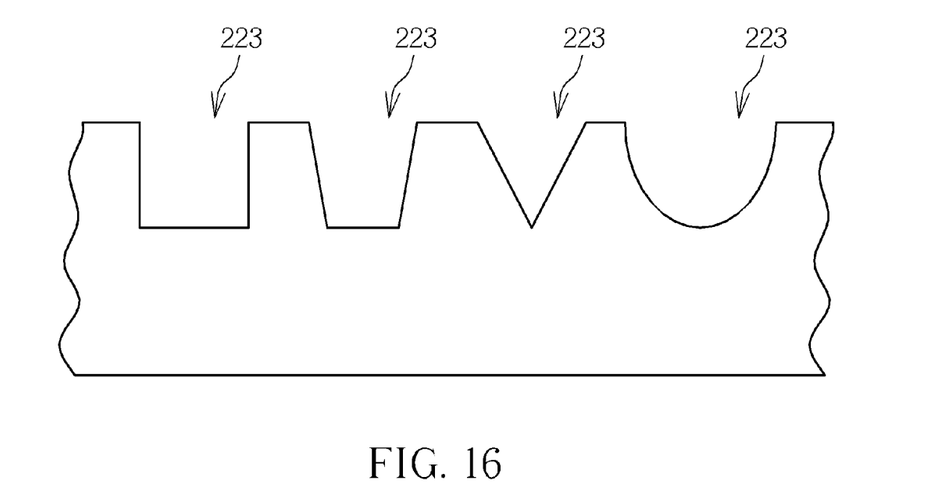
FIG. 16 illustrates various embodiments of the trench of the present invention.

The pad opening 222 is formed in the first dielectric layer 220. Besides, the via 221 is formed inside the pad opening 222 so that the pad opening 222 encircles the via 221 from a top view. The via 221 exposes the underlying first patterned conductive layer 210, so the via 221 and the pad opening 222 together define the circuit of the embedded structure 200 of the present invention. Additionally, the first dielectric layer 220 may include a trench 223 which does not encircle the via 221 but may be connected to the via 221, as shown in FIG. 5. The trench 223 may have various shapes, as illustrated in FIG. 16.

Similarly, the inner wall of the trench has a roughness B, the inner wall of the pad opening has a roughness B and the inner wall of the via has a roughness C. If expressed by Ra, the roughness B is between 0.2 µm and 1.5 µm. Again, if expressed by Ra, the roughness C is between 0.5 µm and 5.0 µm. A, B and C are mutually different. The roughness A, B and C have relative relations, for example, C>B>A.

In one embodiment of the present invention, a second conductive layer 230 may fill the via 221, the pad opening 222 and the optional trench 223 to form the embedded circuit structure of the present invention. The second conductive layer 230 usually includes a metal, such as Cu or Al, which may be formed by an electroless plating procedure. If the first dielectric layer 220 includes the metallic complex, the first dielectric layer acts as a seed layer for the second conductive layer 230.

The substrate 201 includes a third patterned conductive layer 240 and an interconnection 214 for electrically connecting the first patterned conductive layer 210 and the third patterned conductive layer 240, as shown in FIG. 5. The third patterned conductive layer 240 may include a metal, such as Cu or Al.

In order to achieve a substantially even surface for the outer surface 224 of the first dielectric layer 220, in another embodiment of the present invention, the embedded circuit structure of the present invention may include an organic film layer 250 covering the first dielectric layer 220 and selectively exposing the via 221, the pad opening 222 and the optional trench 223 to protect the outer surface 224 of the first dielectric layer 220. The organic film layer 250 may include a hydrophilic polymer to be optionally removed by water. For instance, the hydrophilic polymer may include functional groups such as hydroxyl group (—OH), amide group (—CONH$_2$), sulfonic group (—SO$_3$H) and/or carboxylic group (—COOH).

Alternatively, the organic film layer 250 may include a hydrophobic polymer. For instance, the hydrophobic polymer may be methacrylate resin, vinyl phenyl resin, allyl resin, polyacrylate resin, polyether resin, polyolefin resin, polyamide resin, or polysiloxane resin.

Figure 6:
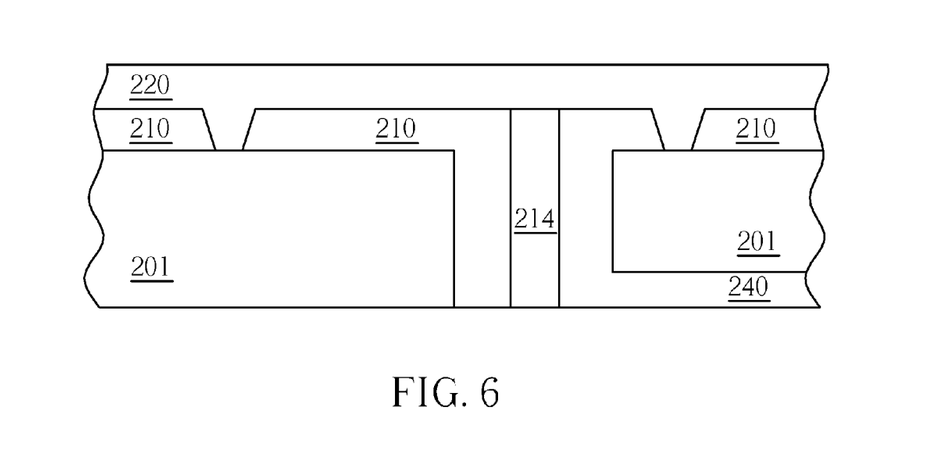
FIGS. 6-15 illustrate an embodiment of the method for defining an embedded circuit structure of the present invention.

The present invention continues to provide a method for defining an embedded circuit structure and further for forming the embedded circuit structure. Please refer to FIGS. 6-15, illustrating an embodiment of the method for defining an embedded circuit structure of the present invention. As shown in FIG. 6, first a substrate 201 is provided. The substrate 201 includes a first patterned conductive layer 210 disposed thereon. The first patterned conductive layer 210 may selectively expose the substrate 201. Also, a first dielectric layer 220 is formed to cover the first patterned conductive layer 210 and the substrate 201. The substrate 201 may be a non-conductive material for a circuit board. The substrate 201 includes a third patterned conductive layer 240 and an interconnection 214 for electrically connecting the first patterned conductive layer 210 and the third patterned conductive layer 240, as shown in FIG. 6. The first conductive layer 210 or the third patterned conductive layer 240 may include a metal, such as Cu or Al.

In one embodiment of the present invention, the first dielectric layer 220 may further include a metallic complex, such as Mn, Cr, Pd or Pt. Once activated, such as by laser, the first dielectric layer 220 helps another conductive layer to deposit with the help of the metallic complex.

Figure 7:
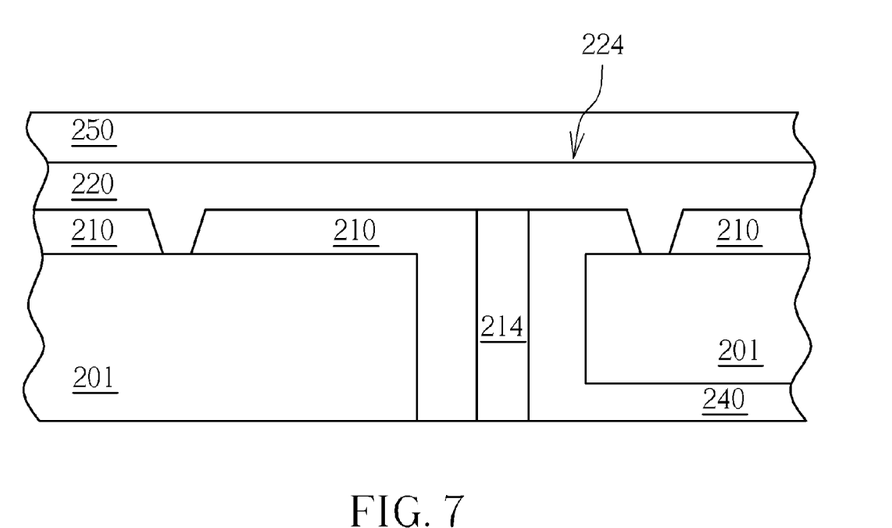

Second, as shown in FIG. 7, a first organic film layer 250 is formed to cover the first dielectric layer 220. Accordingly, the first organic film layer 250 is capable of protecting the outer surface 224 of the first dielectric layer 220 from any undesirable damages. The first organic film layer 250 may include a hydrophilic polymer to be optionally removed by water. For instance, the hydrophilic polymer may include functional groups such as hydroxyl group (—OH), amide group (—CONH$_2$), sulfonic group (—SO$_3$H) and/or carboxylic group (—COOH). Alternatively, the organic film layer 250 may include a hydrophobic polymer. For instance, the hydrophobic polymer may be methacrylate resin, vinyl phenyl resin, allyl resin, polyacrylate resin, polyether resin, polyolefin resin, polyamide resin, or polysiloxane resin.

The outer surface 224 of the first dielectric layer 220 have an original roughness A, for example, substantially even. The roughness may be expressed by either one of the parameters Ra. If expressed by Ra, the roughness A is <0.5 μm.

Figure 8:
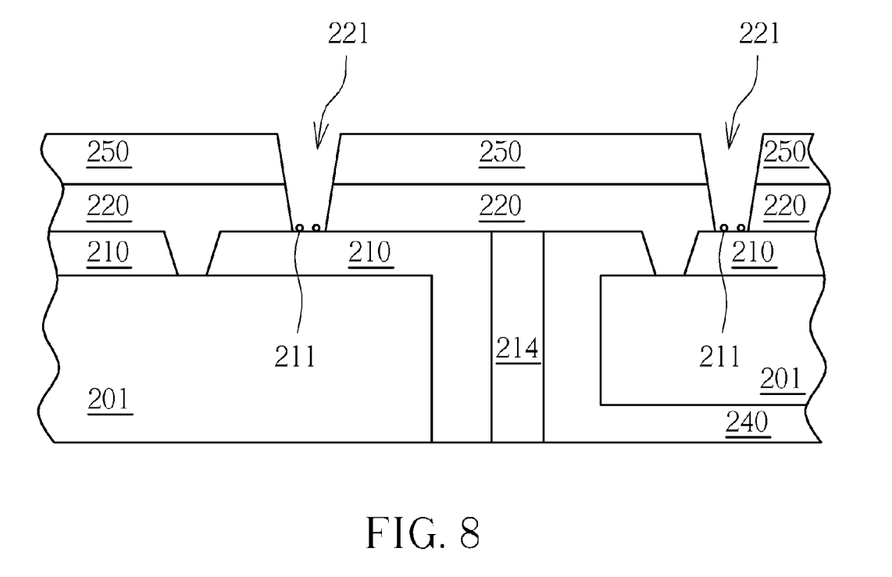

Then, as shown in FIG. 8, at least one via 221 is formed in the first dielectric layer 220 and in the first organic film layer 250. The via 221 penetrates the first dielectric layer 220 and the first organic film layer 250 to expose the underlying first patterned conductive layer 210. The via 221 may be formed by using laser to remove part of the first dielectric layer 220 and part of the first organic film layer 250.

Figure 9:
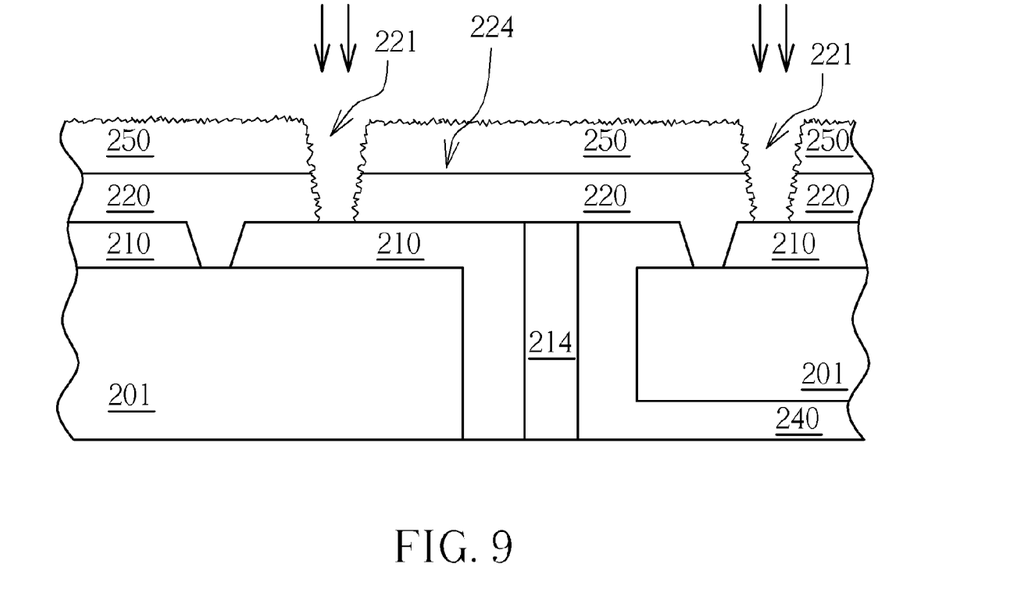

Afterwards, a first cleaning step is performed to desmear the exposed surface of the first patterned conductive layer 210. As described earlier, because some residues 211 may scatter on the exposed surface of the first patterned copper layer 210 and would therefore hinder the following electric connection, a desmearing procedure is needed, as shown in FIG. 9, to remove all the residues 211 on the exposed surface of the first patterned copper layer 210 in order to facilitate the following electric connection. The first cleaning step may include the use of energy particles, such as plasma, or of an oxidizing agent, such as permanganate. As described, in addition to removing all the residues 211 on the exposed surface of the first patterned copper layer 210, the desmearing procedure also etches the inner surface of the first dielectric layer 220 as well as the first organic film layer 250, and leaves both the inner surface of the first dielectric layer 220 and of the first organic film layer 250 damaged, i.e. a rugged surface, as shown in FIG. 9. However, thanks to the protection of the first organic film layer 250, the outer surface 224 of the first dielectric layer 220 is kept from the damages of the first cleaning step and retains its original roughness A, for example a substantially even surface.

The following procedures are optional depending on whether the exposed surface of the first patterned copper layer 210 needs further cleaning. When the exposed surface of the first patterned copper layer 210 does not need further cleaning and the first organic film layer 250 remains on the first dielectric layer 220, the following procedures are skipped.

Figure 10:
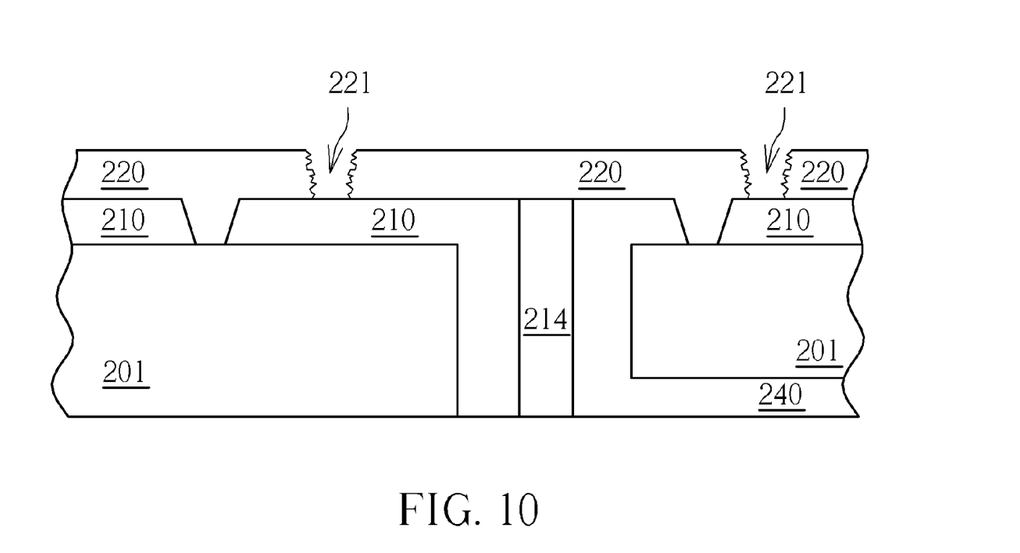
Figure 11:
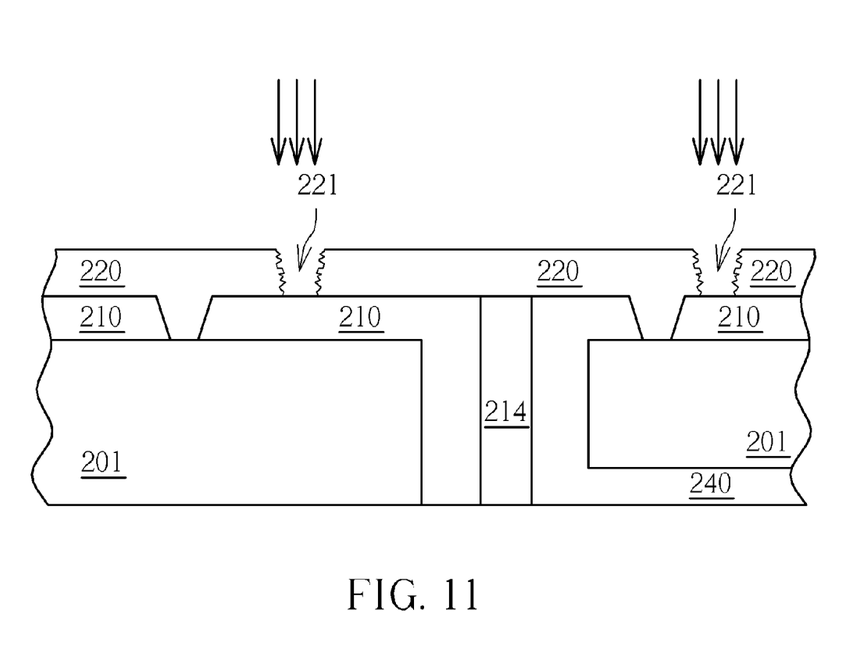

If the first organic film layer 250 includes a hydrophilic polymer, the first organic film layer 250 may be washed off by water, as shown in FIG. 10. To be continued, a second cleaning step, namely micro-etching, is performed to again clean the exposed first patterned conductive layer 210 as shown in FIG. 11. The second cleaning step may be carried out by using certain oxidizing agent (s), such as sodium persulfate plus sulfuric acid, or hydrogen peroxide plus sulfuric acid or dilute sulfuric acid alone.

Figure 12:
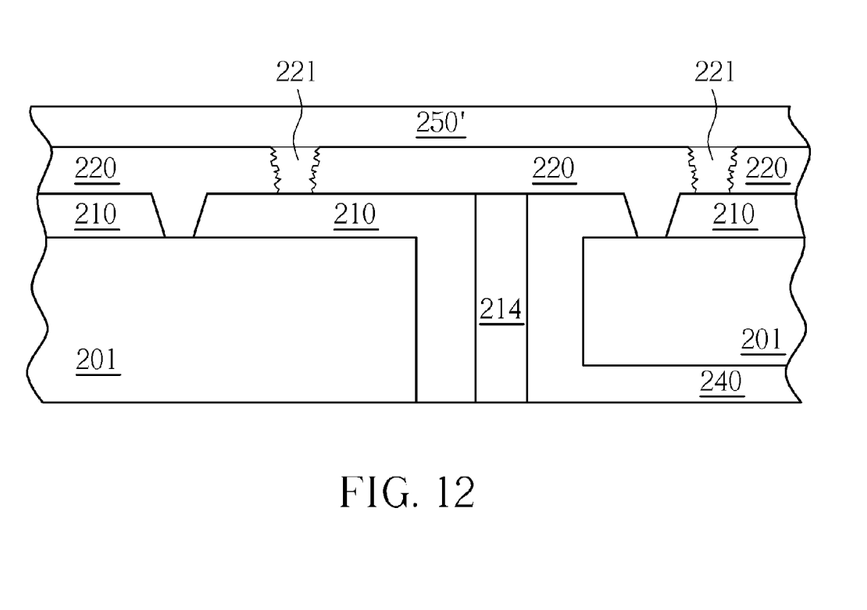

After the second cleaning step is finished, a second organic film layer 250' is again formed to cover the first dielectric layer 220 and the vias 221, as shown in FIG. 12. If the above optional procedures are not carried out, the first organic film layer 250 is now the first organic film layer 250. In the following descriptions, it is anyway called the organic film layer 250'.

The organic film layer 250' is capable of protecting the outer surface 224 of the first dielectric layer 220 from any undesirable damages. The organic film layer 250' may include a hydrophilic polymer to be optionally removed by water. For instance, the hydrophilic polymer may include functional groups such as hydroxyl group (—OH), amide group (—CONH$_2$), sulfonic group (—SO$_3$H) and/or carboxylic group (—COOH).

Alternatively, the organic film layer 250' may include a hydrophobic polymer. For instance, the hydrophobic polymer may be methacrylate resin, vinyl phenyl resin, allyl resin, polyacrylate resin, polyether resin, polyolefin resin, polyamide resin, or polysiloxane resin.

Figure 13:
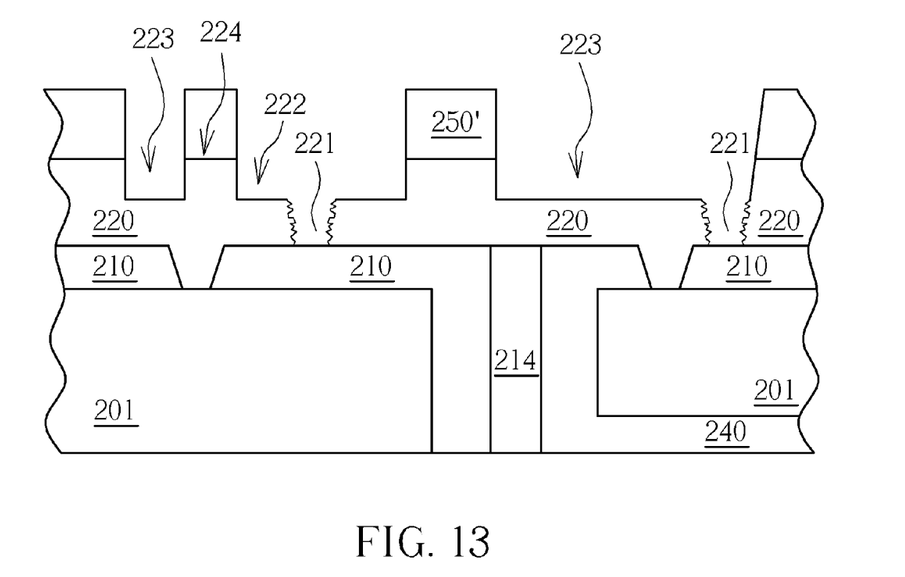

No matter the above optional procedures are carried out or not, as shown in FIG. 13, afterwards, the first dielectric layer 210 and the organic film layer 250' are patterned to form pad opening 222, optional trenches 223 and simultaneously to reinforce the via 221. The pad opening 222 encircles, or in other words, overlaps with the via 221, and the via 221 and the pad opening 222 together define the embedded circuit structure of the present invention.

By contrast with the pad opening 222, the trench 223 does not encircle the via 221 but may be connected to the via 221. Similarly, the pad opening 222, and the optional trench 223 may be formed by using laser to remove part of the first dielectric layer 220 and part of the organic film layer 250'. When the pad opening 222 and the optional trench 223 are formed, the inner wall of the trench 223 has a roughness B and the inner wall of the pad opening 222 has a roughness B. If expressed by Ra, the roughness B is between 0.2 μm and 1.5 μm.

The formation of the pad opening 222 and the optional trench 223 also reinforces the via 221, so the inner wall of the via 221 may have a different roughness, namely roughness C. Again, if expressed by Ra, the roughness C is between 0.5 μm and 5.0 μm. A, B and C are mutually different. Preferably, the roughness A, B and C have relative relations. For example, C>B>A.

If the first dielectric layer 220 includes the metallic complex, the formation of the pad opening 222 and the optional trench 223 also activates the metallic complex. Once activated, such as by laser, the first dielectric layer 220 helps another conductive layer to deposit with the help of the metallic complex.

Figure 14:
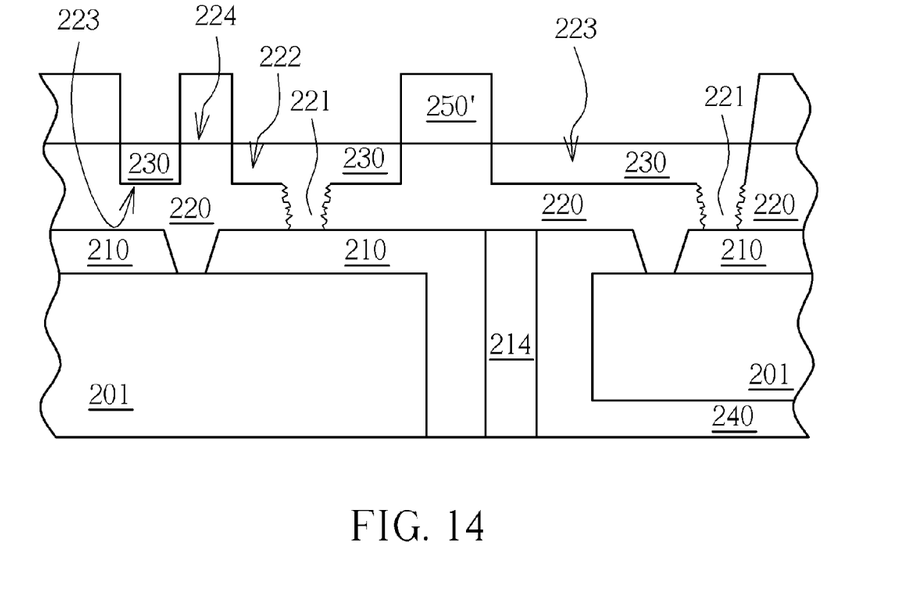

In order to form the embedded circuit structure of the present invention, as shown in FIG. 14, a first deposition step is performed to form a second conductive layer 230 in the via 221, the pad opening 222 and the trench 223. Preferably, the first deposition step is an electroless plating procedure. If the first dielectric layer 220 includes the metallic complex and is activated by the formation of the pad opening 222 and the optional trench 223, the first dielectric layer acts as a seed layer for the electroless plating. The second conductive layer 230 usually includes a metal, such as Cu or Al. If necessary, a second deposition step, such as electroplating, is optionally performed so that the second conductive layer 230 fills the via 221, the pad opening 222 and the trench 223. Because the inner wall of the via, the pad opening and the trench are formed or reinforced after the cleaning step(s), less copper lumps will be formed and a conductive layer of better quality can be obtained due to a smoother surface.

Figure 15:
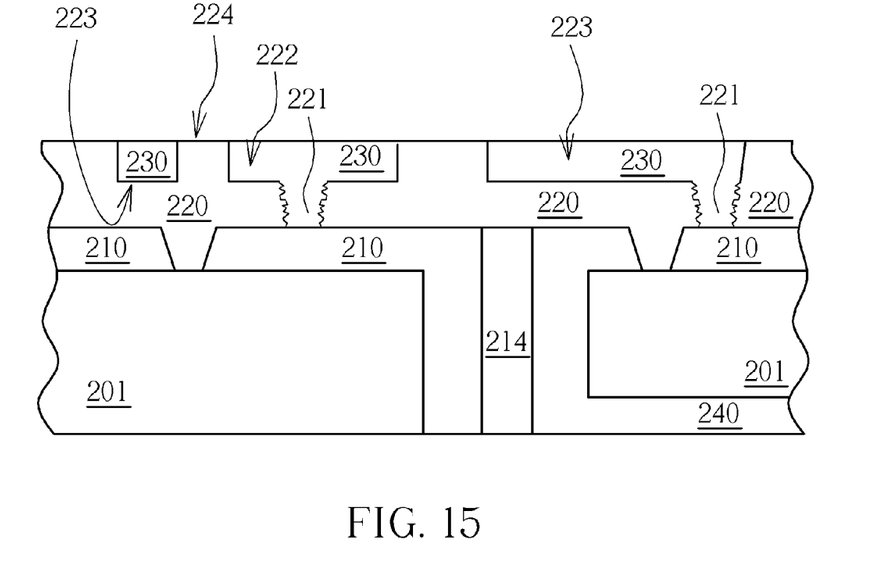

Optionally, the organic film layer 250' may remain on the first dielectric layer 210 or not. If negative, the organic film layer 250' is removed, so as to leave the first dielectric layer 220 a substantially even surface, as shown in FIG. 15. When the organic film layer 250' includes a hydrophilic polymer, the organic film layer 250' may be washed off by water.

Because the embedded circuit structure of the present invention has gone through a patterning step after the first cleaning step, the inner wall of the via, the pad opening and the trench of the present invention may have a smoother surface. Moreover, less copper lumps will be formed and a conductive layer of better quality can be obtained when a layer of copper is later deposited on the inner wall of the embedded structure of the present invention due to the smoother surface. The smoother surface is able to raise the reliability of the embedded structure of the present invention. In addition, the embedded structure of the present invention may further have a substantially even outer surface because of the protection of the first and the second organic film layer during the manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An embedded structure, comprising:
   a substrate;
   a first patterned conductive layer disposed on said substrate and selectively exposing said substrate;
   a first dielectric layer, covering said first patterned conductive layer and said substrate, wherein an outer surface of said first dielectric layer has a substantially even surface with a roughness A;
   a pad opening formed in said first dielectric layer, wherein the surface of said first dielectric layer in said pad opening has a roughness B;
   a trench formed in said first dielectric layer, wherein an inner wall of said trench has said roughness B; and
   a via formed in said pad opening and exposing said first patterned conductive layer, wherein said via and said pad opening together define said embedded structure, the surface of said first dielectric layer in said via has a roughness C and the roughness of A, B and C are mutually different.

2. The embedded structure of claim 1, wherein said substrate comprises a third patterned conductive layer and an interconnection for electrically connecting said first patterned conductive layer and said third patterned conductive layer.

3. The embedded structure of claim 1, wherein C>B>A.

4. The embedded structure of claim 1, further comprising:
   a second conductive layer filling said via and said pad opening to form an embedded circuit structure.

5. The embedded structure of claim 1, wherein said roughness A is expressed by Ra<0.5 µm.

6. The embedded structure of claim 1, wherein said roughness B is expressed by 0.2 µm<Ra<0.5 µm.

7. The embedded structure of claim 1, wherein said roughness C is expressed by 0.5 µm<Ra<5.0 µm.

8. The embedded structure of claim 1, further comprising an organic film layer covering said first dielectric layer and selectively exposing said via and said pad opening, wherein said organic film layer comprises a hydrophilic polymer, wherein said hydrophilic polymer comprises a functional group selected form a group consisting of hydroxyl group (—OH), amide group (—CONH$_2$), sulfonic group (—SO$_3$H) and carboxylic group (—COOH).

9. The embedded structure of claim 1, further comprising an organic film layer covering said first dielectric layer and selectively exposing said via and said pad opening, wherein said organic film layer comprises a hydrophobic polymer, wherein said hydrophobic polymer is selected form a group consisting of methacrylate resin, vinyl phenyl resin, allyl resin, polyacrylate resin, polyether resin, polyolefin resin, polyamide resin, and polysiloxane resin.

10. An embedded structure, comprising:
    a substrate;
    a first patterned conductive layer disposed on said substrate and selectively exposing said substrate;
    a first dielectric layer, covering said first patterned conductive layer and said substrate, wherein said first dielectric layer comprises a metallic complex, and an outer surface of said first dielectric layer has a substantially even surface with a roughness A;
    a pad opening formed in said first dielectric layer, wherein the surface of said first dielectric layer in said pad opening has a roughness B; and
    a via formed in said pad opening and exposing said first patterned conductive layer, wherein said via and said pad opening together define said embedded structure, the surface of said first dielectric layer in said via has a roughness C and the roughness of A, B and C are mutually different.

11. The embedded structure of claim 10, wherein said substrate comprises a third patterned conductive layer and an interconnection for electrically connecting said first patterned conductive layer and said third patterned conductive layer.

12. The embedded structure of claim 10, further comprising:
    a trench disposed in said first dielectric layer, wherein an inner wall of said trench has said roughness B.

13. The embedded structure of claim 10, wherein C>B>A.

14. The embedded structure of claim 10, further comprising:
    a second conductive layer filling said via and said pad opening to form an embedded circuit structure.

15. The embedded structure of claim 14, wherein said first dielectric layer acts as a seed layer for said second conductive layer.

16. The embedded structure of claim 10, wherein said metallic complex comprises a metal selected from a group consisting of Mn, Cr, Pd and Pt.

17. The embedded structure of claim 10, wherein said roughness A is expressed by Ra<0.5 µm.

18. The embedded structure of claim 10, wherein said roughness B is expressed by 0.2 µm<Ra<0.5 µm.

19. The embedded structure of claim 10, wherein said roughness C is expressed by 0.5 µm<Ra<5.0 µm.

20. The embedded structure of claim 10, further comprising:
    an organic film layer covering said first dielectric layer and selectively exposing said via and said pad opening.

* * * * *